(12) United States Patent
Itzler et al.

(10) Patent No.: US 6,515,315 B1
(45) Date of Patent: Feb. 4, 2003

(54) AVALANCHE PHOTODIODE FOR HIGH-SPEED APPLICATIONS

(75) Inventors: Mark A. Itzler, Princeton, NJ (US); Chen Show Wang, Warren, NJ (US); Nicholas J. Codd, Ewing, NJ (US); Suzanne McCoy, Hamilton, NJ (US)

(73) Assignee: JDS Uniphase, Corp., West Trenton, NJ (US)

( * ) Notice: Subject to any disclaimer, the term of this patent is extended or adjusted under 35 U.S.C. 154(b) by 0 days.

(21) Appl. No.: 09/634,455

(22) Filed: Aug. 7, 2000

Related U.S. Application Data
(60) Provisional application No. 60/147,277, filed on Aug. 5, 1999.

(51) Int. Cl.[7] .............................. H01L 31/0304
(52) U.S. Cl. ........................................ 257/186
(58) Field of Search ........................... 257/186

(56) References Cited

U.S. PATENT DOCUMENTS

| | | | | |
|---|---|---|---|---|
| 4,481,523 A | * | 11/1984 | Osaka et al. | 257/186 |
| 4,857,982 A | | 8/1989 | Forrest | |
| 4,876,209 A | | 10/1989 | Forrest | |
| 5,144,381 A | * | 9/1992 | Furuyama et al. | 257/186 |

* cited by examiner

Primary Examiner—Gene M. Munson
(74) Attorney, Agent, or Firm—Kudirka & Jobse LLP

(57) ABSTRACT

A method for designing an avalanche photodiode for high bit rate or high speed applications is disclosed. The photodiode is made up of a multiplication layer of a first semiconductor material, an absorption layer of a second semiconductor material and a field control layer of a third semiconductor material having. The field control layer has a moderate doping of a first type dopant and is intermediate between the multiplication and absorption layers. A central region of the multiplication layer is diffused with a second type dopant which results in a diffused region having a greater thickness in the center than in the periphery of the diffused region.

16 Claims, 8 Drawing Sheets

AVALANCHE PHOTODIODE FOR HIGH-SPEED APPLICATIONS

PRIORITY INFORMATION

This application claims priority under 35 U.S.C. §§119 and/or 365 from Provisional Application No. 60/147,277, filed on Aug. 5. 1999; the entire content of which is hereby incorporated by reference.

FIELD OF THE INVENTION

This invention relates to avalanche photodiodes, and more particularly, to an improved design for avalanche photodiodes for use in high-speed or high bit rate applications.

BACKGROUND OF THE INVENTION

A need for greater cross-sectional bandwidth in fiber optic network links is widely recognized. The volume of data transmissions has seen a dramatic increase in the last decade. This trend is expected to grow exponentially in the near future. As a result, there exists a need for deploying an infrastructure capable of handling this increased volume and for improvements in system performance.

Fiber optics have gained prominence in telecommunications, instrumentation, cable TV, network, and data transmission and distribution. Major application of fiber optics has been, and will continue to be, in the area of telecommunications. There has been a significant changeover from wires and co-axial cables to optical fibers for telecommunication systems and information services. This change is dictated by the benefits of improved technology as well as economics. Increasing cost and demand for high data rate or large bandwidth per transmission channels and the lack of available space in already congested conduits in every metropolitan area are a key reason in the change over from the wires to fiber optics. Additionally, fiber optical devices interface well with digital data processing equipment, and their technology is compatible with modem microelectronic technology.

In order to avoid the expensive alternative of installing more optical fiber, system designers have traditionally leveraged two technological advances: higher bit transmission rates (time-division multiplexing) and increased number of wavelength channels (wavelength-division multiplexing). The challenge of developing component-level devices with adequately enhanced performance has been addressed by component manufacturers with some progress having been made in a number of areas. A particular example is the development of high-sensitivity optical receivers for performing optical-to-electrical signal conversion at data rates in excess of 10 gigabytes per second (Gb/s).

A canonical fiber optic receiver, such as the one illustrated in FIG. 6, for long-wavelength signals (e.g., 1310 or 1550 nm) contains an InGaAs/InP (Indium-Galium-Arsenide/Indium-Phosphide) photodiode 610 and a trans-impedance amplifier (TIA) 620 as well as post-amplification, clock and data recovery circuitry 630 and a demultiplexer 640 for the high-frequency bit stream. The sensitivity of a receiver, defined as the lowest signal power detected with an acceptably low bit error rate, depends on the front-end elements. There are two options for the photodiode element: a standard p-i-n diode structure, and an avalanche photodiode (APD).

The function of the photo detector in a fiber optic communication link is to convert optical power into electrical response. The most common detector used in fiber applications is the photodiode, which acts as a converter of optical power to electrical current. The type of semiconductor photodiode commonly used for fiber optics application has a reverse bias p-n junction.

As stated above, the two most commonly used photo detectors are the p-i-n photodiode (positive/intrinsic/negative type conductivity) and the avalanche photodiode (APD). Both types of photodiodes are instantaneous photon-to-electron converters where absorbed photons generate hole-electron pairs to produce an electric current. The p-i-n (or pin) and avalanche photodiodes are actually modified p-n junction devices with additional layers at differing doping levels that produce either more efficient quantum conversion or avalanche gain through ionization. A photon is absorbed in a relatively high E (electric) field region, where an electron-hole pair is created. This will produce current in the detector circuit.

In order to obtain high quantum efficiency, the p-i-n photodiode provides absorption in an InGaAs active region. The photo-current of a p-i-n diode is, however, intrinsically quantum-limited. That is, in a best case scenario, each input photon results in only a single electron-hole pair to contributing to the total photo-current.

An alternative approach to the p-i-n photodiode is one in which higher detector currents are created as a result of the avalanche gain effect, as in the case of an avalanche photodiode (APD). Although the APD requires higher operating voltages which must be compensated for temperature shifts, the internal gain of the APD provides a significant enhancement in receiver sensitivity and can be a key enabler in the manufacturing of high sensitivity optical receivers for high speed applications. APDs exhibit internal gain through avalanche multiplication. In the presence of sufficiently high electric field intensity, an initial photon-induced carrier can seed an avalanche process in which carriers obtain enough energy from the electric field to generate additional carrier pairs through impact ionization. By such an effect, a single photon can give rise to tens or even hundreds of carriers which contribute to the resulting photo current.

The avalanche multiplication process is, however, inherently noisy due to its stochastic nature. Under a specific bias condition, the average multiplication gain M is generally the most likely number of carrier pairs created by a given photon; but, there is also a significant probability that any given photon will give rise to M−1 pairs, M+1 pairs, or some other value within a distribution around M. This "excess noise" contribution (which is gain-dependent) can make the APD much noisier than a p-i-n diode in an absolute sense. The noise generated can be a limiting factor on detectivity. However, the comparative usefulness of these devices must be considered in the context of the entire receiver. As long as the avalanche noise is no greater than the noise from other components in the receiver (such as amplifiers), the APD provides a significant increase in the receiver SNR. The increased SNR is particularly attractive at higher frequencies where increased amplifier noise is unavoidable.

FIG. 1 illustrates an increase in receiver signal-to-noise ratio (SNR) when an APD is used. The SNR is directly related to sensitivity. A fundamental noise limitation of an optical receiver is the noise floor of the amplifier which follows the photo-diode. The signal and noise of an APD with unity gain (M=1) are nominally identical to those of a p-i-n diode, and the SNR under this condition is illustrated along the ordinate (vertical axis) of FIG. 1. An increase in the APD signal can be achieved by increasing the gain (along the horizontal axis). This leads to a direct increase in the receiver SNR as long as the APD noise remains less than the amplifier noise floor. The SNR is maximized at an optimum value of the APD gain for which the APD noise is approximately equal to the amplifier noise. Note in FIG. 1 that this is true even though the APD noise may increase faster with gain than the APD signal does.

For low frequency applications, amplifiers can be designed with extremely low noise. Therefore, in the context of lower frequency digital transmission, the use of an APD may not provide a significant benefit. However, at higher bit rates such as 2.5 and 10 Gb/s for example, the sensitivity enhancement of an APD-based receiver can be considerable in relation to a comparably designed p-i-n-based receiver. For InGaAs/InP APDs which are appropriate for long-wavelength telecommunications signals, APD receivers designed for 2.5 Gb/s signals typically provide at least a 7 dB improvement over p-i-n receivers. For data rates of 10 Gb/s, this improvement is slightly less or, approximately 6 dB.

It is desirable to have higher sensitivity in an optical receiver. One measure can be roughly approximated from the cost of optical amplification, which is approximately $1000 per dB. If an APD receiver at 2.5 Gb/s provides an additional 7 dB to a designer's power budget for a few hundred dollars more than a p-i-n receiver, then the economic advantage of an APD solution over a p-i-n solution becomes more attractive. The APD receiver also offers greater flexibility through its wider dynamic range. However, the complexities of system design at 10 Gb/s introduce additional considerations. For example, in a situation where fiber-induced dispersion poses a greater constraint on signal propagation length than fiber-induced signal attenuation, the higher sensitivity of an APD receiver might seem to offer little advantage. But additional margin in the power budget can provide tolerance for the losses associated with components such as dispersion compensation modules which help to alleviate the fundamental dispersion constraints.

Another context in which the benefit of APD receivers might seem questionable is that of multiple wavelength channels present on a single fiber. If all channels can be simultaneously optically amplified before being split off to p-i-n receivers, then the cost per dB of optical amplification can be substantially reduced by spreading the cost among all the wavelength channels. APD receivers will remain relevant in this situation as long as the design of the APD chip itself enables future costs which do not compare too unfavorably with those of p-i-n diodes. Furthermore, this realization of point-to-point multi-channel transport may have more limited scope in the near future. There is a much greater desire for flexible networks in which wavelength channels serve as the coarse-grained units to be independently added, dropped, and otherwise manipulated. In this scenario, the additional sensitivity of APD-based receivers will provide inexpensive power budget margin for the many network branches which will are likely to be introduced to handle individual wavelengths.

Despite the utility of the APD-based receiver, the design of a high performance, reliable and easily manufactured APD for use at high bit rates poses a challenge. The desire to detect wavelengths in the 1300 nm to 1600 nm range dictates the use of an $In_{0.53}Ga_{0.47}As$ absorption layer grown lattice-matched to an InP substrate, as in standard telecommunications p-i-n diodes. The need to achieve avalanche multiplication requires the presence of sufficiently high electric fields, but the narrow bandgap InGaAs (bandgap $\epsilon_g\sim0.75$ eV) suffers from intolerably large tunneling leakage currents at electric fields lower than those required to exhibit significant avalanche multiplication in this material.

APD design is complicated by additional factors such as the difficulty of controlling premature avalanche breakdown at the edge of the device. The geometry of planar diffused junctions includes inherent curvature at the junction periphery. This curvature causes locally enhanced electric fields, and the consequent enhanced avalanche at the junction periphery leads to an undesirable non-uniformity in the multiplication profile across the device.

What is desired, therefore, is a device which minimizes noise while maximizing sensitivity and increasing bandwidth for high speed applications.

SUMMARY OF THE INVENTION

Accordingly, an object of the present invention is to design a device which minimizes noise.

Another object of the present invention is to design a device which maximizes sensitivity.

A further object of the present invention is to design a device which has an increased bandwidth for high speed applications.

An additional object of the present is to design a device which optimizes the combination of noise, sensitivity and bandwidth.

These and other objects of the present invention are achieved by a separate absorption and multiplication (SAM) avalanche photodiode (APD) having a double diffusion performed on the multiplication layer. In other embodiments the diffusion may be combined with a simultaneously diffused floating guard rings to reduce edge breakdown and increase the bandwidth for high bit rate or high speed applications.

BRIEF DESCRIPTION OF THE DRAWINGS

The above objects and features of the present invention will be more apparent from the following description of the preferred embodiments with reference to the accompanying drawings, wherein.

DETAILED DESCRIPTION OF PREFERRED EMBODIMENTS

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practices in other embodiments that depart from these specific details. In other instances, detailed descriptions of well-known methods, devices and circuits are omitted so as not to obscure the description of the present invention.

Figure 1:
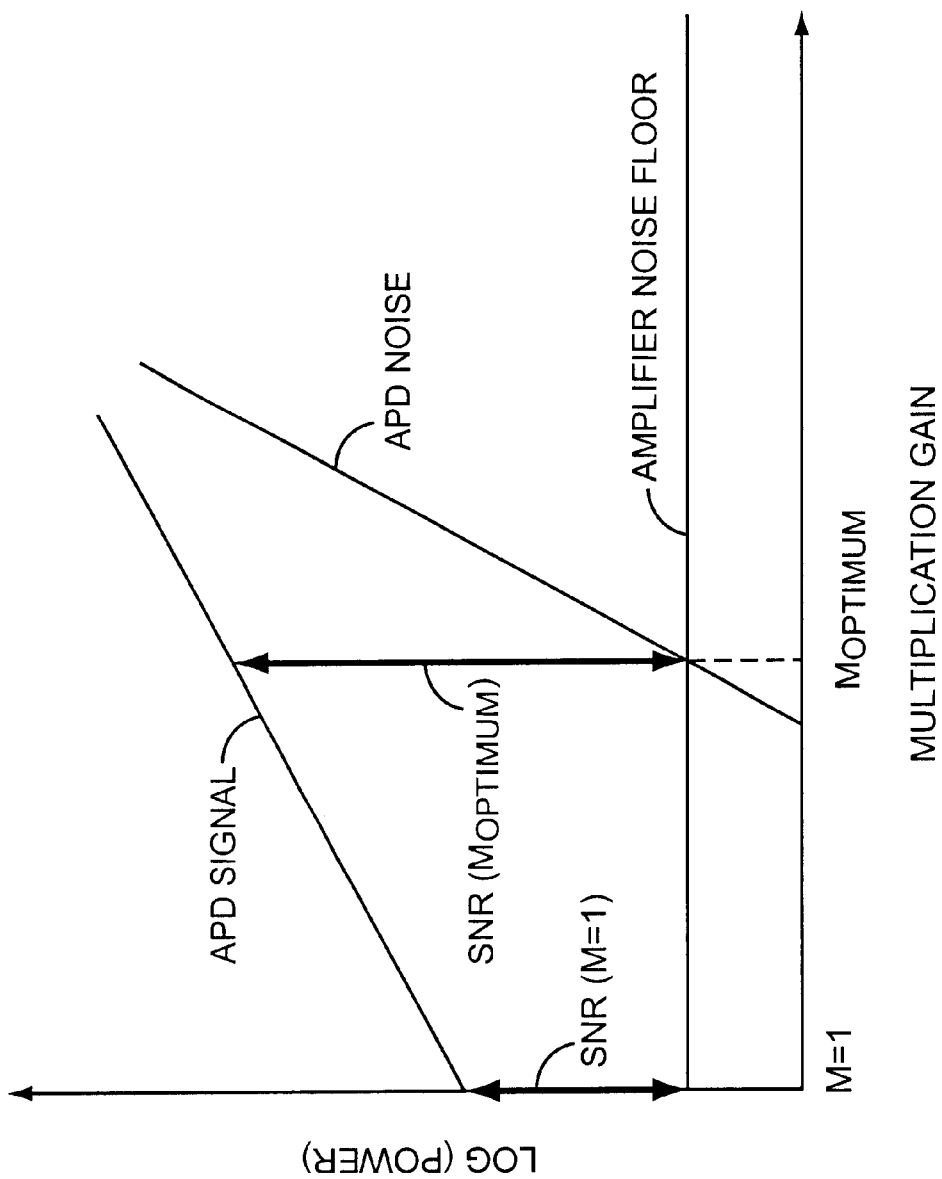
FIG. 1 illustrates the signal-to-noise ratio (SNR) of an optical receiver.
Figure 2:
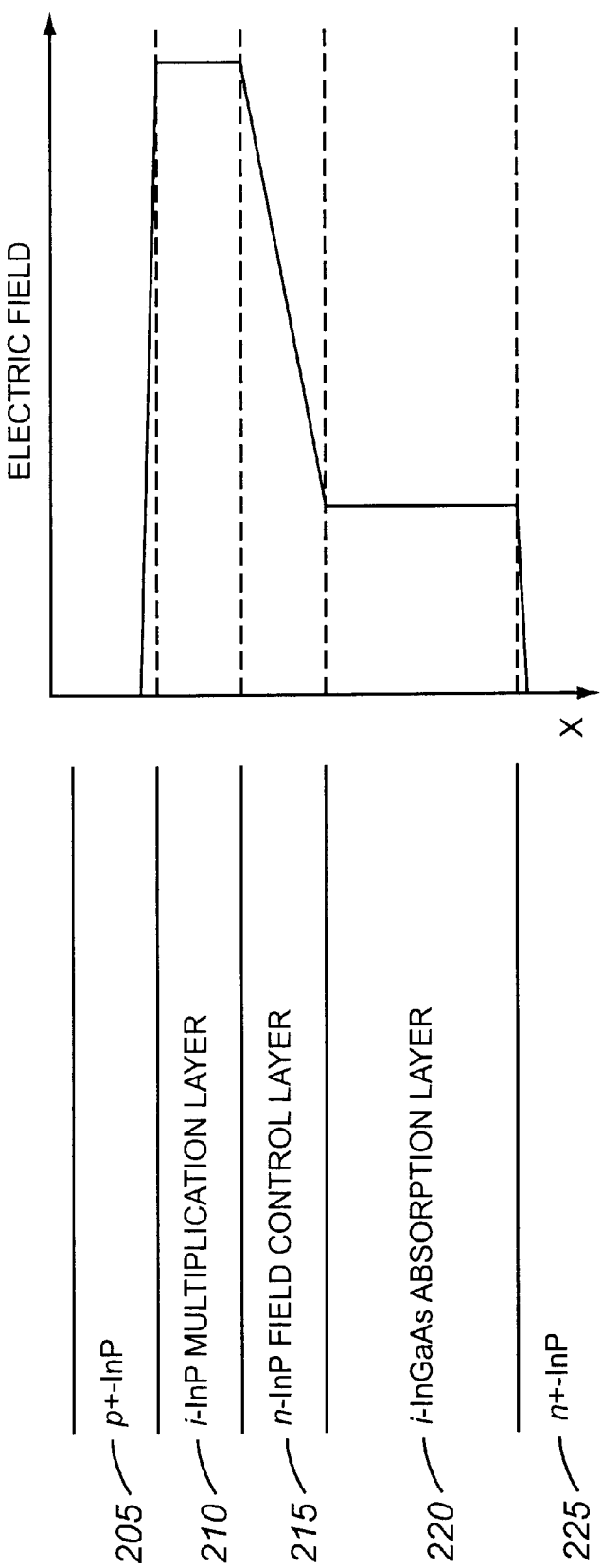
FIG. 2 illustrates a prior art epitaxial structure of separate absorption and multiplication (SAM) avalanche photodiode (APD)

According to exemplary embodiments of the present invention, the limitations of a photodiode in high bit rate applications may be overcome by the adoption of a separate absorption and multiplication (SAM) APD structure in which the absorption and multiplication functions are relegated to different layers of the device. The SAM APD is a device capable of achieving high sensitivity at a longer wavelength (between 950 to 1650 nm). The epitaxial structure of a SAM APD is illustrated in FIG. 2. The top layer 205 is made up of indium phosphide and is heavily doped with p-type material such as zinc for example. This results in the layer 205 losing its semiconductor properties and causes it to function more like a conductor. The multiplication layer 210 has low doping or no doping. The field control layer 215 is moderately doped with n-type of material. The absorption layer 220 also has low doping or no doping. The last layer 225 is heavily doped with n-type material such as sulfur, for example, such that this layer no longer behaves as a semiconductor but instead has reasonably good conductivity.

The field control layer 215 of moderately doped InP is designed to maintain low electric field in the InGaAs absorption layer while supporting high field in an InP multiplication layer. The heavy doping of layer 205 with p-type material results in a rapid, almost instantaneous increase in the electric field; conversely, the heavy doping of layer 225 with n-type material results in an almost instantaneous drop in the electric field. The low or no doping of layers 210 and 215 results in a constant electric field. The wider bandgap InP ($\epsilon_g$~1.35 eV) exhibits avalanche multiplication without tunneling and is transparent to wavelengths longer than 950 nm. The SAM-APD structure has been adopted in all commercially available APDs for long-wavelength telecommunication applications, but beyond this rudimentary concept, design details vary widely. Unlike the standard p-i-n diode (which is sufficiently simple and mature that virtually all commercially available devices are quite similar in design), the InGaAs/InP APD exists in many variations.

Regardless of bit rate, a critical APD design issue, if not the most critical issue, is maintaining gain uniformity across the active area of the device. The tendency for enhancement of electric fields at the edge of the active area is a basic property of the physics of finite-size planar p-n junctions. These enhanced edge fields lead to larger gain at the device edges and premature "edge breakdown" which has markedly deleterious effects on device performance, particularly the noise performance and bandwidth of the APD. Reduction of the electric field intensity at the device edges is a key for alleviating edge breakdown. In this regard, a number of approaches have been taken.

Generally speaking, the techniques for controlling edge breakdown in planar junctions may be grouped into one of three general approaches. These approaches include: (i) controlling the doping density at junction edges (conventional guard rings); (ii) controlling the total charge profile in the field control layer; and (iii) controlling the junction profile.

Figure 3:
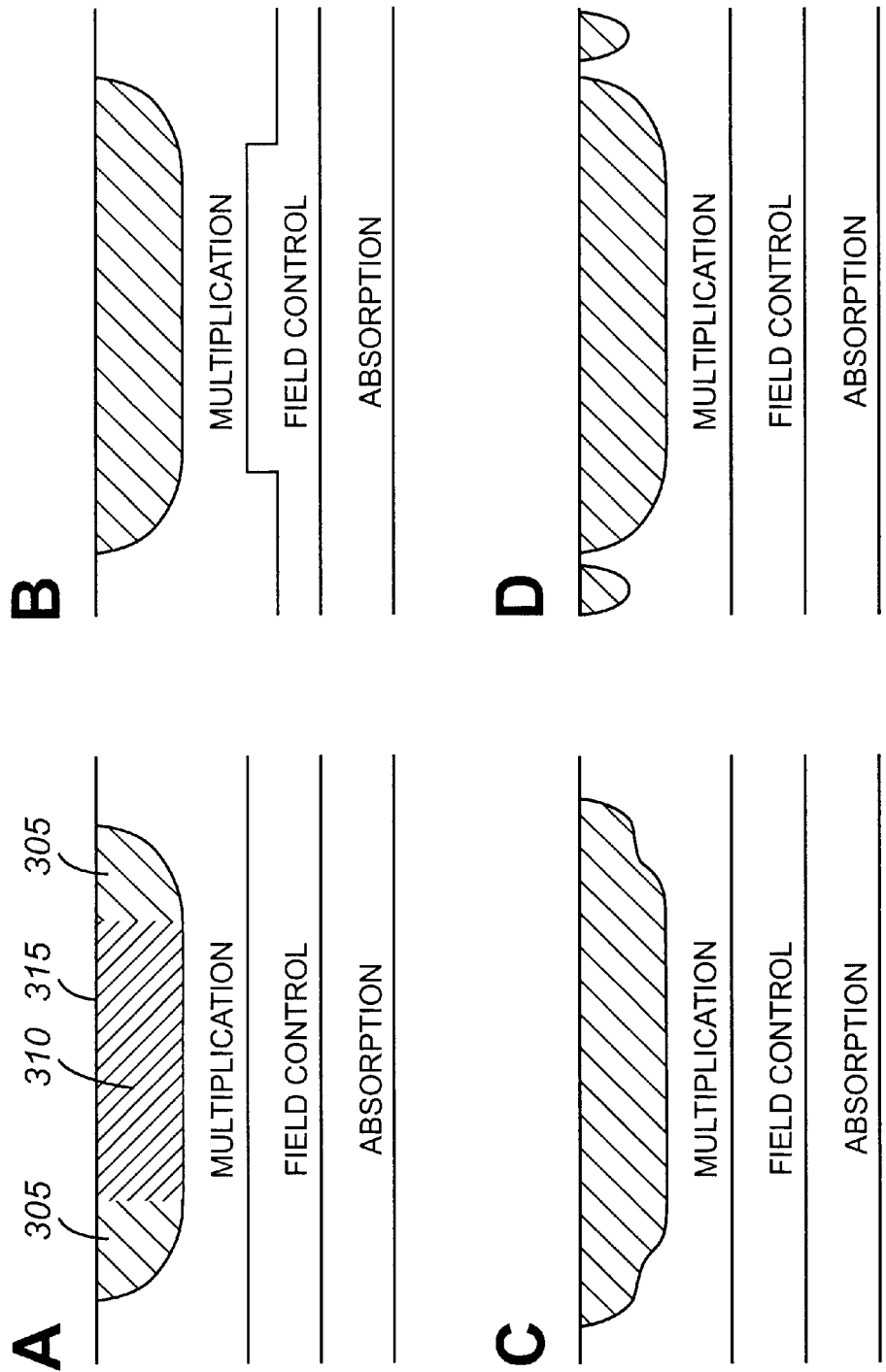
FIGS. 3a to 3d illustrate methods for reducing electric field intensity at junction edges.

With respect to the doping density approach, as illustrated in FIG. 3a, edge fields are reduced by employing a lower doping density in the device periphery 305 than in the device center 310. This peripheral region 305 (both the left and right sides combined) may typically include the outermost 10 to 20% of the device diameter 315. For moderate bit-rate APDs (such as 2.5 Gb/s, for example), a typical active area diameter may be 50 microns, and the lower doped peripheral region 305 may encompass a 5 to 10 micron annulus surrounding this active area 310. This low doping in the device periphery is accomplished by using ion implantation or low temperature diffusion of an appropriate dopant. The periphery dopant is typically different from the dopant which was used to create the central region of the junction. One dopant that may be used for creating the p-n junction's central region in long-wavelength SAM-APDs is zinc for example; the lower doping in the periphery may be accomplished by using another element such as cadmium for example.

With respect to the charge profile approach, as illustrated in FIG. 3b, two epitaxial growth steps may be required: (i) epitaxy is carried out up to the field control layer, a mesa etch is performed on this layer; and then (ii) a subsequent epitaxial re-growth completes the structure. The goal of this approach is to create a structure with lower integrated field control charge in the device periphery (e.g., 20 to 40% less charge) so that avalanche multiplication in the periphery is suppressed.

With the junction profile approach, as illustrated in FIG. 3c, a junction of constant doping density is shaped to create a wider multiplication region with consequently lower electric fields in the peripheral region of the device. One method for realizing such a shaped profile is through the use of multiple diffusions of the same dopant (e.g., zinc) employing different diameters for successive concentric diffusions. In using two successive diffusions, the first (outer) diffusion would typically have a diameter 10 to 25 microns wider than the second (inner) diffusion. For example, a moderate bit-rate APD can be created using a first diffusion of 60 microns followed by a second, concentric diffusion of 40 microns. Appropriate execution of such diffusions results in a wider multiplication region (e.g., recessed by 0.5 microns relative to a central area diffusion depth of 2 to 4 microns) in the device periphery.

A related concept is the use of "floating" guard rings, as illustrated in FIG. 3d, which have the same doping as the central region of the active area but are electrically isolated from the central region and tend to lower the surface electric fields when the junction is biased. According to exemplary embodiments of the present invention, the use of floating guard rings may be combined with the junction profile shaping approach described above by appropriate inclusion of a simultaneous guard ring diffusion during one of the successive diffusions (e.g., the first, or outer, diffusion) employed to achieve shaping of the junction profile.

An exemplary embodiment of the present invention employs an APD design based on the third concept (i.e., controlling the junction profile). A device designed using this concept utilizes both a shaped junction profile created using two diffusions (as in FIG. 3c) and floating guard rings (as in FIG. 3d). An advantageous aspect of this approach is that the device can be fabricated using a simple, technologically mature diffusion process which is well-established in the making of standard p-i-n diodes. This consistency in fabrication technique provides these modified design APDs with the same level of process control that is present in p-i-n diode manufacturing as well as high reliability.

Figure 7:
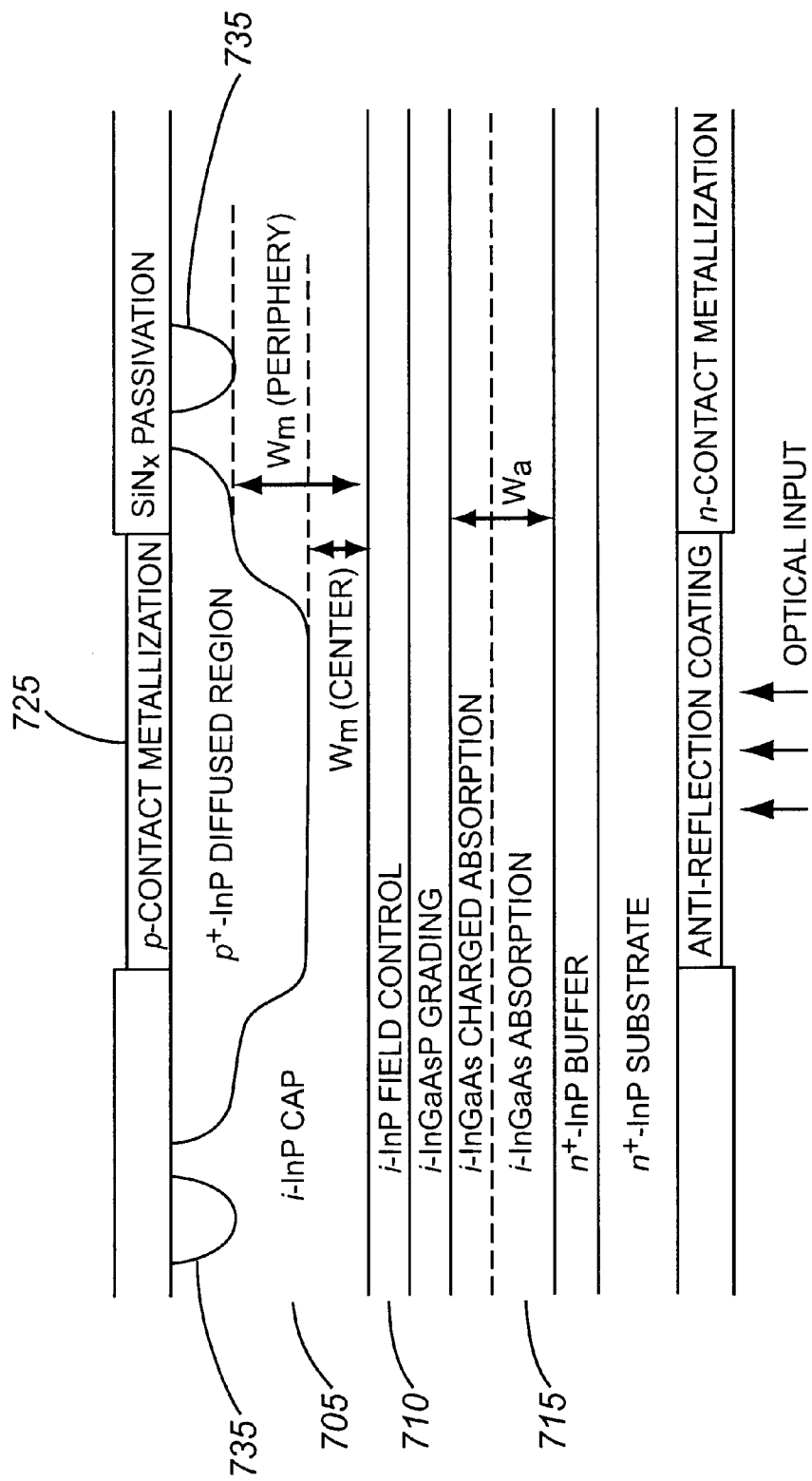
FIG. 7 illustrates the structure of an APD according to exemplary embodiments of the present invention.

The structure 700 of an avalanche photo diode designed according to exemplary embodiments of the present invention is illustrated in FIG. 7. The structure utilizes a separate absorption and multiplication (SAM) structure with a bulk InP multiplication layer 705 and an InGaAs absorption layer 715. A moderately doped InP field control layer 710, intermediate to the multiplication and absorption layers 705 and 715, maintains high electric field that is sufficient to generate avalanching in the multiplication region while keeping the electric field in the InGaAs absorption region low enough to avoid tunneling.

Edge breakdown is controlled by shaping the diffusion profile of the device by using a double diffusion technique to create a wider multiplication region 705 with a higher breakdown voltage around the device periphery. Simultaneously diffused floating guard rings 735 may also be used to further reduce surface fields. The material used as the dopant for the diffusion in this exemplary embodiment is zinc. In the diffused region 725, a heavy doping of p-type material takes place.

The shaping of the diffusion profile for controlling edge breakdown requires a good understanding of the dependence of the breakdown voltage on the multiplication width, $V_b(W_m)$. An analytical model which reduces the structure to its two primary layers, the multiplication and absorption layers, provides a great deal of insight. The change in $V_b$ due to a change in $W_m$ is well-approximated by $$\frac{\partial V_b}{\partial W_m} = E_b + \frac{\partial E_b}{\partial W_m}(W_m + W_a) \quad (1)$$

where $V_b$ is the breakdown voltage, $E_b$ is the peak electric field in the multiplication region at breakdown, $W_m$ is the width of the multiplication region, and $W_a$ is the width of the absorption layer. The right hand side of Eq. (1) indicates two competing effects. The first term arises from the change $\Delta V_b = E_b \Delta W_m$ that will occur when $W_m$ is increased by $\Delta W_m$ in the presence of $E_b$. (This description assume a low enough doping across $W_m$ that the field in this layer is essentially constant, but this approach is easily generalized to different dopings.) The second term arises from the dependence of the breakdown field $E_b$ on $W_m$. For large $W_m$ (e.g., $W_m > 0.5$ micron), this dependence is weak; but for thin $W_m$ appropriate to high bandwidth APDs, smaller $W_m$ results in higher $E_b$ values since higher fields are required to achieve the requisite number of ionizing collisions consistent with breakdown for each traversal of a carrier across the thinner multiplication region.

Figure 8:
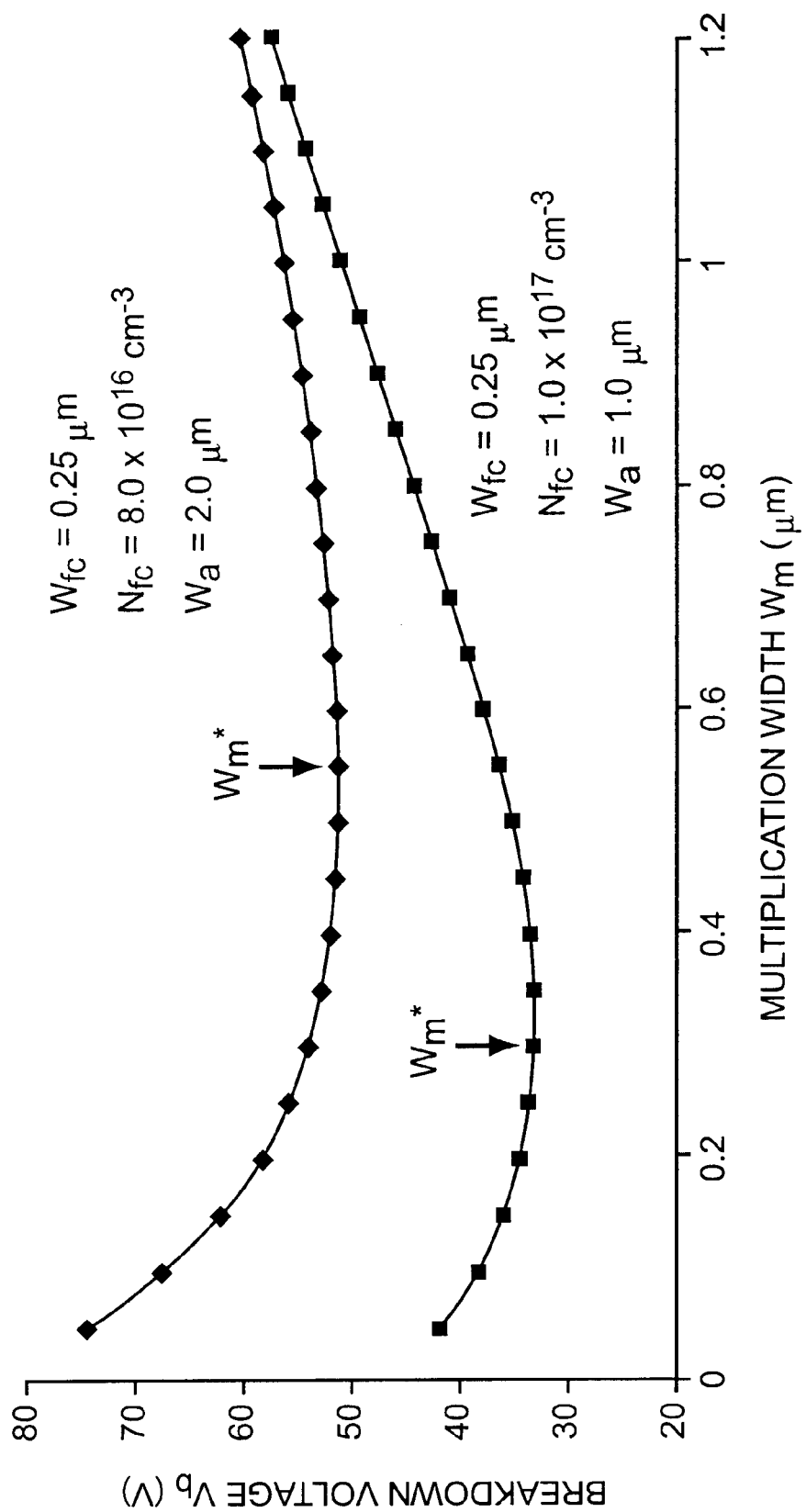
FIG. 8 illustrates breakdown voltage as a function of the multiplication layer width according to exemplary embodiments of the present invention.

A minimum in $V_b$ occurs at $W_m = W_m^*$ where the two competing effects cancel. This point is illustrated in FIG. 8, which contains the results of numerical simulation carried out to confirm the analytic work just described. If the central part of the APD junction is diffused too deeply so that $W_m$ is much less than $W_m^*$, then $V_b$ at the device center will be higher than it is at the device periphery, and edge breakdown is certain to occur.

There is an inherent tradeoff between high gain-bandwidth (G-BW) product, which requires a thinner multiplication width $W_m$, and control of edge breakdown, which is achieved with thicker multiplication width $W_m > W_m^*$ at the edges of the device active area. This tradeoff is manageable if $W_m^*$ can be made smaller. By setting the right side of Eq. (1) to zero and using an appropriate relationship for $E_b(W_m)$, a solution for $W_m^*$ shows that smaller $W_m^*$ can be obtained when smaller $W_a$ is used. As seen in the lower curve in FIG. 8, a value of $W_a$ in the range of 1.0 microns gives $W_m^* \sim 0.2$–$0.3$ microns (as needed for high G-BW products) while maintaining sufficient optical power absorption to give a responsivity of at least 0.7 A/W for an optical signal of 1550 nm commonly used in high-speed fiber optic links. Adequate bandwidth performance for use at 10 Gb/s is possible using the shaped diffusion profile approach only of the value of $W_a$ is tuned appropriately to simultaneously provide high bandwidth and suppression of edge breakdown.

With the methods described above (i.e., determining values for $W_m$, $W_m^*$ and $W_a$), the diffusion process will enable an APD designed according to exemplary embodiments of the present invention to provide adequate bandwidth at high bit rates without having to combine the diffusion with floating guard rings.

Figure 4:
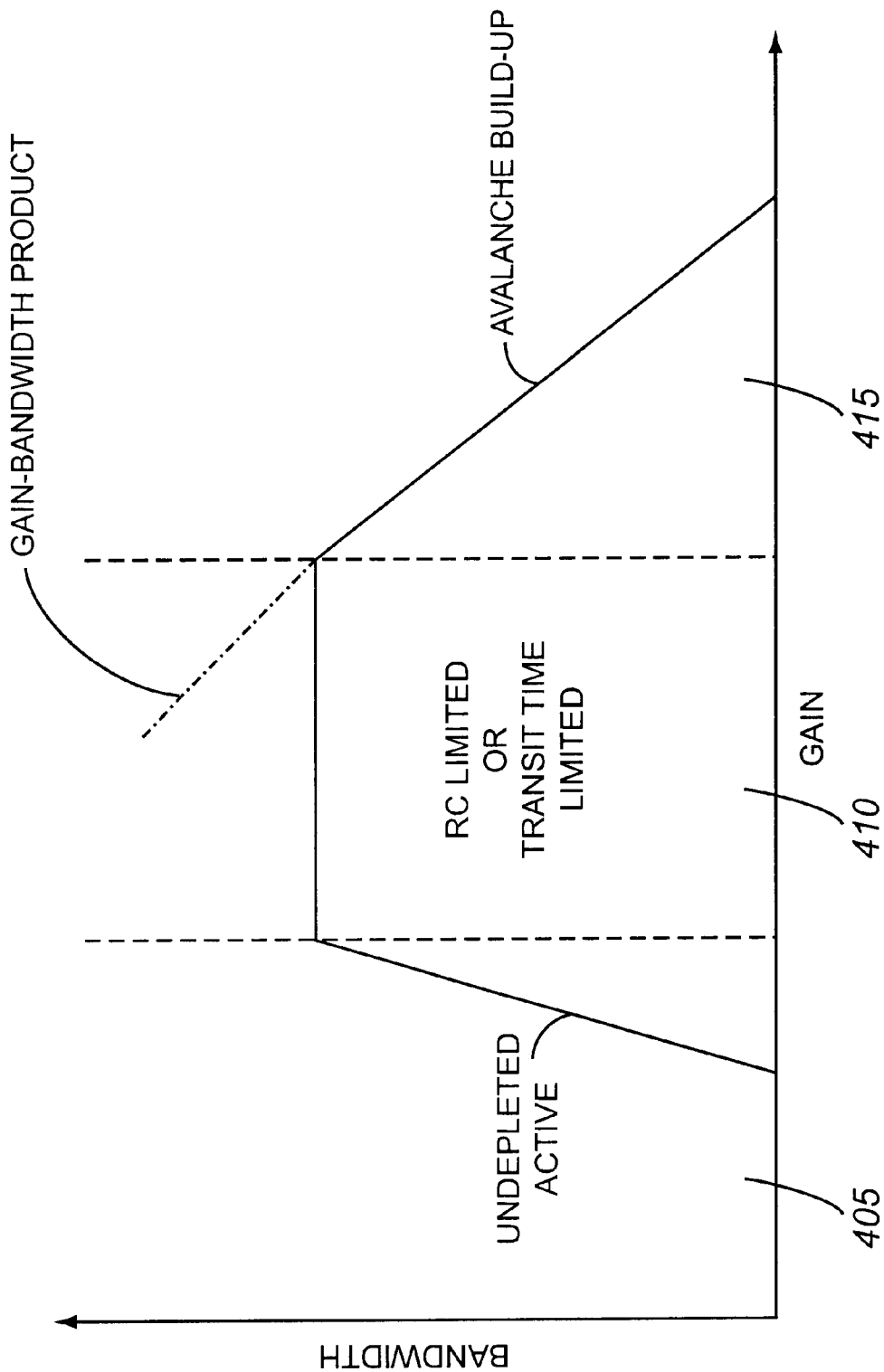
FIG. 4 illustrates APD bandwidth in various gain regions.

The APD has numerous potential bandwidth limitations, and there are three distinct gain regions in which different phenomena pose the limiting bandwidth factors as illustrated in FIG. 4. In the low gain region 405, the internal electric field does not extend across the absorption layer, and high bandwidth can not be achieved because photo-excited carriers will experience only a slow, diffusive motion. At moderate gain region 410, carriers are swept by a finite electric field across the entire device (as illustrated in FIG. 2), and the bandwidth limitation in this region is either the carrier transit time or the RC time constant of the device. For high gain operation (region 415), the time for the avalanche process to occur in the multiplication region becomes the bandwidth-limiting factor, and the larger the gain, the larger the duration of the avalanche process. In this region (i.e., high), gain and bandwidth are inversely related and are characterized by a constant gain-bandwidth (G-BW) product. A substantial amount of research on multiple quantum wells (also referred to as superlattice structures) has been focused on increasing the G-BW product by band-gap engineering. However, larger G-BW products can also be obtained in simple bulk materials (e.g., InP) by using thinner multiplication layers.

For use in 10 Gb/s receivers, APDs achieve at least 7 to 8 GHz of bandwidth over the desired range of operating gain. Maximum sensitivity is typically found for multiplication gains of M~10, which dictates that G-BW products of 80 GHz or more are desired. The epitaxial layer thicknesses and device area must be designed so that the transit time and RC time constant do not limit the bandwidth to less than 8 GHz. For example, transit times sufficiently fast for 10 Gb/s operation can be achieved in pin photodiodes using InGaAs absorption regions of approximately 2 microns in thickness. Assuming the photodetector is driving a 50 ohm load, capacitances low enough for 10 Gb/s operation can be achieved using devices with active area diameters no greater than 30 to 40 microns.

Figure 5:
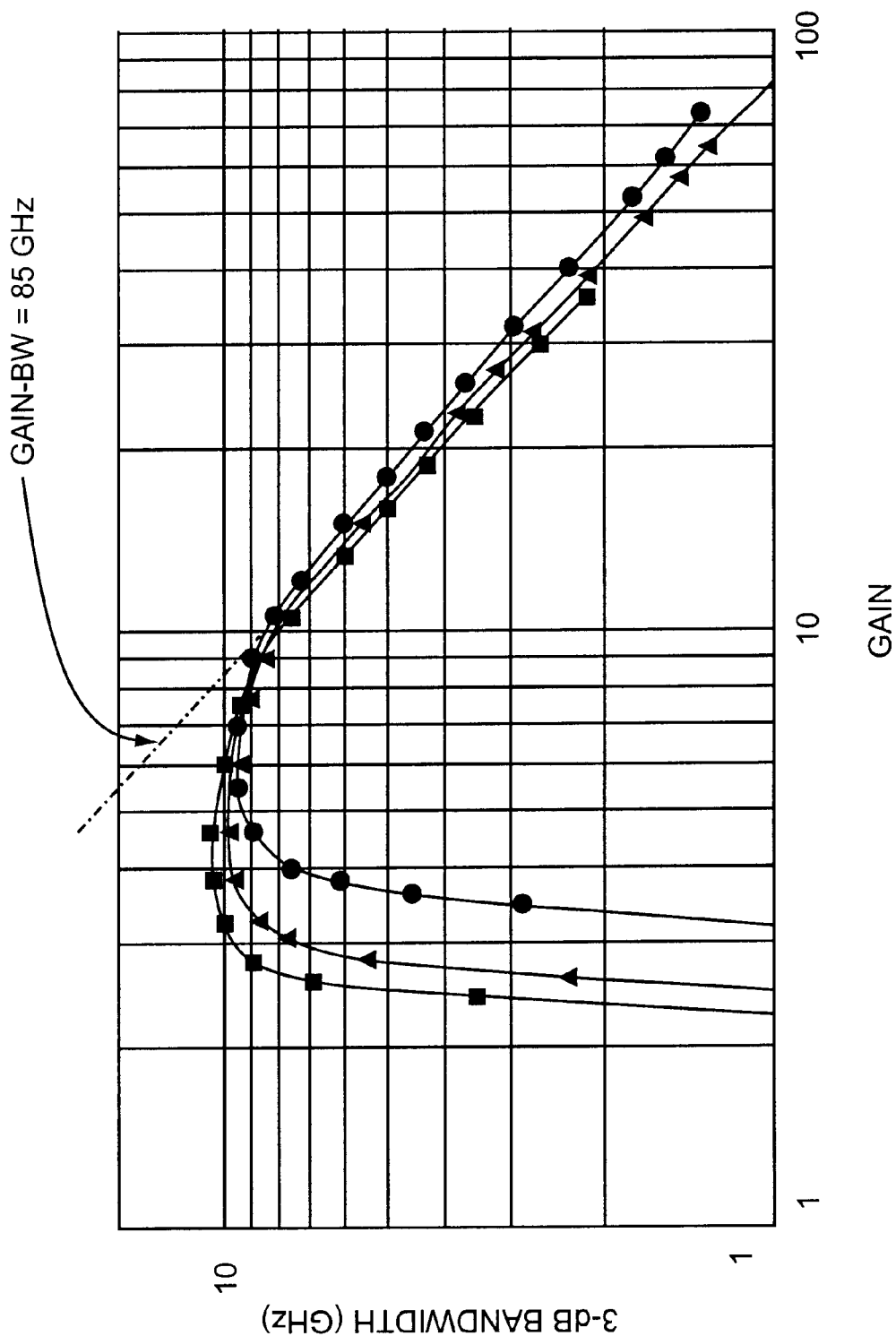
FIG. 5 illustrates bandwidth as a function of gain and the gain-bandwidth for a high speed APD according to exemplary embodiments of the present invention.
Figure 6:
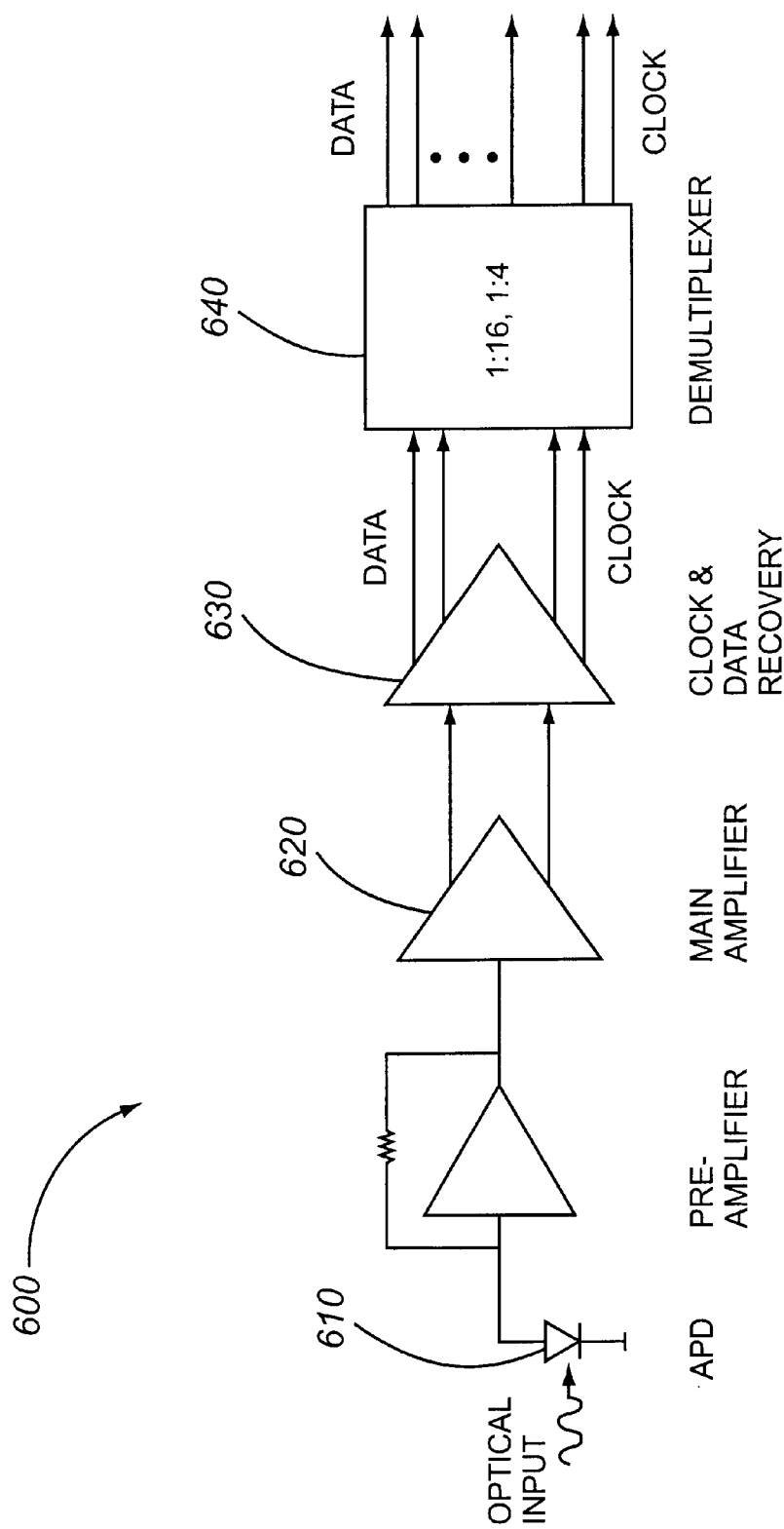
FIG. 6 illustrates a fiber optic receiver.

It is also important to achieve high bandwidth at low gain. Larger optical powers which overload the pre-amplifier at high APD gain can be accommodated if the APD can be operated at low gain while still maintaining sufficient bandwidth. Generally, there is a trade-off between high bandwidth at low gain and at high gain, as illustrated by data in FIG. 5 measured using a 10 Gb/s APD designed according to exemplary embodiments of the present invention. If the APD is not the bandwidth-limiting element in the receiver when the gain is optimized for sensitivity (i.e., M~10), compromising high-gain bandwidth to obtain high bandwidth at lower gain will enhance the receiver's dynamic range. Receivers which include APDs according to exemplary embodiments of the present invention can achieve −27 dBm sensitivity (at a $10^{-10}$ bit error rate) using GaAs p-HEMT TIAs, and this performance represents a 5 to 6 dB sensitivity enhancement relative to comparably designed p-i-n-based receivers.

Through the use of design strategies according to exemplary embodiments of the present invention and implemented using established fabrication technologies, reliable, manufacturable APDs for use in 10 Gb/s optical receivers have been realized. Although these devices are considerably more difficult to make than 2.5 Gb/s APDs, the fact that the same design approach was feasible at both bit rates has contributed substantially to the success of 10 Gb/s APDs. Yield and reproducibility will continue to improve as the epitaxial growth of this material progresses. The consistency of device performance is critically affected by the epitaxial base material uniformity as well as by the consistency of the device fabrication process.

Exemplary techniques of the present invention may also be suitable for designing commercial APDs capable of performance greater than 10 Gb/s. For applications at 10 Gb/s, the APDs designed according to present invention meet the goal of optimizing noise, sensitivity and bandwidth.

The foregoing has described the principles, preferred embodiments and modes of operation of the present invention. However, the invention should not be construed as being limited to the particular embodiments described above. The above-described embodiments should be regarded as illustrative rather than restrictive, and it should be appreciated that variations may be made in those embodiments by those skilled in the art without departing from the scope of the present invention as defined by the following claims.

What is claimed is:

1. An avalanche photodiode comprising:

an absorption layer comprising a first semiconductor region within which optical energy is absorbed and electron-hole pairs are created, the absorption layer having a width $W_a$; and a multiplication layer comprising a second semiconductor region within which the presence of a high electric field induces avalanche multiplication of electron-hole pairs from the absorption layer, the multiplication layer having a width $W_m$ at the center of the second region such that the relative widths satisfy the relation:

$$\delta V_b/\delta W_m = E_b + \delta E_b/\delta W_m (W_m + W_a)$$

where $V_b$ is the breakdown voltage at a center of the photodiode and $E_b$ is the peak electric field in the multiplication layer at breakdown, $W_a$ being such that $V_b$ is substantially minimized for a multiplication width $W_m$ less than 0.4 μm.

2. A photodiode according to claim 1 further comprising a field control layer located between the multiplication layer and the absorption layer.

3. A photodiode according to claim 1 wherein the photodiode has a doping profile that results in the multiplication layer being wider away from a center of the photodiode structure.

4. A photodiode according to claim 1 wherein the photodiode has a doping profile that includes doped guard rings along a periphery of the photodiode structure.

5. A photodiode according to claim 1 wherein the absorption layer has a width $W_a$ of less than 1.5 μm.

6. A photodiode according to claim 1 wherein the breakdown voltage $V_b$ has a minimum at a multiplication layer width $W_m$ of between 0.2 μm and 0.3 μm.

7. An avalanche photodiode comprising:

an absorption layer comprising a first semiconductor region within which optical energy is absorbed and electron-hole pairs are created, the absorption layer having a width $W_a$ less than 1.5 μm; and a multiplication layer comprising a second semiconductor region within which the presence of a high electric field induces avalanche multiplication of electron-hole pairs from the absorption layer, the photodiode having a breakdown voltage $V_b$ that is minimized for a multiplication width $W_m$ less than 0.4 μm, and wherein the shape of the multiplication layer is wider away from a center of the photodiode such that voltage breakdown along edges of the multiplication region is limited.

8. A photodiode according to claim 7 further comprising a field control layer located between the multiplication layer and the absorption layer.

9. A photodiode according to claim 7 wherein the photodiode has a doping profile that includes doped guard rings along a periphery of the photodiode structure.

10. A photodiode according to claim 7 wherein the absorption layer has a width $W_a$ and the multiplication layer has a width $W_m$ at the center of the second region such that the relative widths satisfy the relation:

$$\delta V_b/\delta W_m = E_b + \delta E_b/\delta W_m (W_m + W_a)$$

where $V_b$ is the breakdown voltage at a center of the photodiode and $E_b$ is the peak electric field in the multiplication layer at breakdown.

11. A method of fabricating an avalanche photodiode comprising:

forming an absorption layer comprising a first semiconductor region within which optical energy is absorbed and electron-hole pairs are created, the absorption layer having a width $W_a$ ; and forming a multiplication layer comprising a second semiconductor region within which the presence of a high electric field induces avalanche multiplication of electron-hole pairs from the absorption layer, the multiplication layer having a width $W_m$ at the center of the second region such that the relative widths satisfy the relation:

$$\delta V_b/\delta W_m = E_b + \delta E_b/\delta W_m (W_m + W_a)$$

where $V_b$ is the breakdown voltage at a center of the photodiode and $E_b$ is the peak electric field in the multiplication layer at breakdown, $W_a$ being such that $V_b$ is substantially minimized for a multiplication width $W_m$ less than 0.4 μm.

12. A method according to claim 11 wherein the photodiode has a doping profile that includes doped guard rings along a periphery of the photodiode structure.

13. A method according to claim 11 wherein the absorption layer has a width $W_a$ of less than 1.5 μm.

14. A method according to claim 11 wherein $V_b$ has a minimum at a multiplication layer width $W_m$ of between 0.2 μm and 0.3 μm.

15. A method according to claim 11 wherein a shape of the multiplication layer is wider away from a center of the photodiode such that voltage breakdown along edges of the multiplication region is limited.

16. A method according to claim 11 wherein the absorption layer has a width $W_a$ of less than 1.5 μm.

* * * * *